(12) United States Patent
Banyay et al.

(10) Patent No.: US 10,151,922 B2
(45) Date of Patent: Dec. 11, 2018

(54) WAVEFRONT CORRECTION ELEMENT FOR USE IN AN OPTICAL SYSTEM

(71) Applicant: Carl Zeiss SMT GmbH, Oberkochen (DE)

(72) Inventors: Matus Banyay, Frechen (DE); Martin Weiser, Sinsheim (DE); Boris Bittner, Roth (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/789,200

(22) Filed: Oct. 20, 2017

(65) Prior Publication Data

US 2018/0059413 A1 Mar. 1, 2018

Related U.S. Application Data

(63) Continuation of application No. PCT/EP2016/055107, filed on Mar. 10, 2016.

(30) Foreign Application Priority Data

Apr. 20, 2015 (DE) .......................... 10 2015 207 153

(51) Int. Cl.
*G03F 7/20* (2006.01)
*G02B 27/00* (2006.01)
(Continued)

(52) U.S. Cl.
CPC ....... *G02B 27/0025* (2013.01); *G02B 3/0087* (2013.01); *G02B 5/0891* (2013.01);
(Continued)

(58) Field of Classification Search
CPC ............ G02B 17/0856; G02B 17/0892; G02B 27/0025; G02B 3/0087; G03F 7/70308;
(Continued)

(56) References Cited

U.S. PATENT DOCUMENTS

| 5,650,632 A | 7/1997 | Coufal et al. |
| 7,139,127 B2 | 11/2006 | Arnold et al. |

(Continued)

FOREIGN PATENT DOCUMENTS

| DE | 102008041144 A1 | 3/2009 |
| DE | 102010029570 A1 | 12/2011 |

(Continued)

OTHER PUBLICATIONS

D.T. Attwood: "Soft X-Rays and Extreme Ultraviolet Radiation: Principles and Applications", Cambridge, UK: University Press (2000).

(Continued)

*Primary Examiner* — Michelle M Iacoletti
(74) *Attorney, Agent, or Firm* — Edell, Shapiro & Finnan, LLC

(57) ABSTRACT

A wavefront correction element for an optical system, in particular an optical system of a microlithographic projection exposure apparatus or a mask inspection apparatus, has a carrier film (110, 210, 410) which at least partly transmits electromagnetic radiation that has an operating wavelength of the optical system and that impinges on the carrier film during operation of the optical system. The carrier film (110, 210, 410) is configured such that the real part of the complex refractive index of the carrier film varies over a used region of the surface of the carrier film (110, 210, 410).

18 Claims, 5 Drawing Sheets

(51) Int. Cl.
*G02B 3/00* (2006.01)
*G02B 17/08* (2006.01)
*G02B 5/08* (2006.01)
*G21K 1/06* (2006.01)
*H01S 3/09* (2006.01)

(52) U.S. Cl.
CPC ..... *G02B 17/0856* (2013.01); *G02B 17/0892* (2013.01); *G03F 7/70308* (2013.01); *G03F 7/70316* (2013.01); *G03F 7/70958* (2013.01); *G21K 1/06* (2013.01); *G21K 1/062* (2013.01); *H01S 3/0903* (2013.01)

(58) Field of Classification Search
CPC ... G03F 7/70316; G03F 7/70958; G21K 1/06; G21K 1/062
See application file for complete search history.

(56) References Cited

U.S. PATENT DOCUMENTS

| | | |
|---|---|---|
| 2004/0121134 A1 | 6/2004 | Bijkerk et al. |
| 2010/0165134 A1* | 7/2010 | Dowski, Jr. ............. B24B 13/06 348/218.1 |
| 2014/0220713 A1 | 8/2014 | Dowski, Jr. et al. |
| 2014/0347721 A1 | 11/2014 | Bittner et al. |

FOREIGN PATENT DOCUMENTS

| | | |
|---|---|---|
| DE | 102012202057 A1 | 8/2013 |
| WO | 2004025335 A1 | 3/2004 |
| WO | 2004057378 A1 | 7/2004 |
| WO | 2008020899 A2 | 2/2008 |
| WO | 2011151381 A1 | 12/2011 |

OTHER PUBLICATIONS

H. Ryssel, I. Ruge: "Ion Implantation", J. Wiley & Sons, Chichester 1986, ISBN 0-471-10311-X.

J.J. Cuomo, S.M. Rossnagel, "Handbook of ion beam processing technology", HR Kaufman Noyes Publications, 1989.

Office Action in corresponding German Application 102015207153.7, dated Oct. 27, 2015, along with English Translation.

International Preliminary Report on Patentability and Written Opinion in counterpart International Application No. PCT/EP2016/055107, dated Nov. 2, 2017, 21 pages.

International Search Report in counterpart International Application No. PCT/EP2016/055107, dated Jun. 21, 2016, 6 pages.

* cited by examiner

WAVEFRONT CORRECTION ELEMENT FOR USE IN AN OPTICAL SYSTEM

CROSS REFERENCE TO RELATED APPLICATIONS

The present application is a Continuation of International Application No. PCT/EP2016/055107, filed Mar. 10, 2016, which claims the priority under 35 U.S.C. § 119(a) to German Patent Application DE 10 2015 207 153.7, filed on Apr. 20, 2015. The disclosures of both related applications are considered part of and are incorporated by reference into the disclosure of the present application in their respective entireties.

FIELD OF THE INVENTION

The invention relates to a wavefront correction element for use in an optical system, in particular in an optical system of a microlithographic projection exposure apparatus or a mask inspection apparatus.

BACKGROUND

Microlithography is used for producing microstructured components such as, for example, integrated circuits or LCDs. The microlithography process is carried out in what is called a projection exposure apparatus, which comprises an illumination device and a projection lens. The image of a mask (=reticle) illuminated by way of the illumination device is in this case projected by way of the projection lens onto a substrate (e.g. a silicon wafer) coated with a light-sensitive layer (photoresist) and arranged in the image plane of the projection lens, in order to transfer the mask structure to the light-sensitive coating of the substrate.

Mask inspection apparatus are used for the inspection of reticles for microlithographic projection exposure apparatus.

In projection lenses or inspection lenses designed for the extreme ultraviolet (EUV) wavelength range, i.e. at wavelengths of e.g. approximately 13 nm or approximately 7 nm, owing to the lack of availability of suitable light-transmissive refractive materials, reflective optical elements are used as optical components for the imaging process.

Here it is known, inter alia, to provide a wavefront correction layer on a reflective optical element, the thickness profile of said wavefront correction layer typically being set subsequently in order to correct a wavefront aberration that occurs during the operation of the optical system. Furthermore, the use of a film element operated in transmission as an additional optical wavefront correction element, said film element causing a desired wavefront correction by way of a varying layer thickness profile, is also known.

A problem occurring in practice with the approach mentioned last is that an ablation or addition of carrier material of the film element, undertaken for producing the varying layer thickness profile, may have a mechanical destabilization effect as a consequence.

A further problem occurring in the approaches described above is that, where necessary, a protective layer (e.g. an anti-oxidation protective layer) that is required in practice is still subsequently applied, or applied after producing the respective varying layer thickness profile, as a result of which, in turn, the accuracy of the wavefront modification that is ultimately provided by the wavefront correction element in the optical system is impaired.

With regard to the background art, reference is made by way of example to WO 2013/117343 A1.

SUMMARY

It is an object of the present invention to provide a wavefront correction element for use in an optical system, in particular in an optical system of a microlithographic projection exposure apparatus or of a mask inspection apparatus, said wavefront correction element facilitating the achievement of a wavefront corrective effect that is adjustable as precisely as possible while at least largely avoiding the above-described problems.

A wavefront correction element according to the invention for use in an optical system, in particular in an optical system of a microlithographic projection exposure apparatus or a mask inspection apparatus, comprises:

- a carrier film which at least partly transmits electromagnetic radiation that has an operating wavelength of the optical system and impinges on the carrier film during the operation of the optical system;
- wherein the carrier film is configured in such a way that the real part of the complex refractive index varies over a used region of the surface of the carrier film.

In particular, the invention makes use of the concept of producing a desired wavefront correction by virtue of a wavefront correction element that is operated in transmission and in the form of a carrier film being configured with a suitable variation of the real part of the complex refractive index. This approach is based on the idea that the phase of a wavefront that passes through the wavefront correction element or the carrier film can also be influenced—as an alternative or in addition to a possible thickness variation—by way of a variation in the refractive index, more precisely by the real part thereof that forms the dominant component for the phase.

On account of exploiting a variation of this real part of the complex refractive index according to the invention, the desired wavefront correction can be obtained without the requirement of a thickness variation and a mechanical destabilization of the carrier film which possibly accompanies this.

The complex refractive index n can be written as $$n=(1-\delta)+i\cdot\beta \qquad (1)$$

where $(1-\delta)$ is the real part and $i\cdot\beta$ is the imaginary part of the complex refractive index n. In this representation, the dimensionless parameter $\delta$ describes the deviation of the real part of the refractive index from the value 1 and is the dominant term for the obtained phase change, whereas the dimensionless parameter $\beta$ describes the absorption coefficient. By way of example, a mathematical description is provided in D. T. Attwood: "Soft X-Rays and Extreme Ultraviolet Radiation: Principles and Applications", Cambridge, UK: Cambridge University Press (2000).

Even though the wavefront correction element according to the invention can be configured, in particular, without a thickness variation and, as a consequence, has a substantially plane-parallel geometry in embodiments of the invention, the invention is not restricted thereto. Thus, in further embodiments of the invention, a thickness variation may be present, optionally also in addition to the above-described variation in the refractive index (or the real part thereof). Here, the variation in the refractive index according to the invention can be used, in particular, in the style of a fine correction as well in order to adapt, with an increased accuracy, a wavefront modification caused by an initially provided layer thickness variation of the carrier film to an ultimately desired wavefront to be corrected in the optical system, or vice versa (i.e. a fine correction via layer thickness variation after an initially provided variation in the refractive index).

In particular, the present invention further contains the concept of producing the above-described variation in the real part of the refractive index in a carrier film by doping with impurity atoms (i.e. with atoms of a second material that differs from the first material of the carrier film), wherein this doping has a doping factor that varies over a used region of the surface of the carrier film.

The provision of a wavefront modification by doping the material of the carrier film with impurity atoms, effectuated here according to the invention, has the further advantage over the conventional wavefront modification by way of a layer thickness variation, as described at the outset, that said doping can be effectuated in a final manufacturing step and, in particular, after a previous application of an antioxidative protection layer since said impurity atoms can be supplied without problems through the respective antioxidative protection layer or any other thin protective layer (e.g. in the thickness range of up to 10 nm).

According to an even further advantage, a wavefront modification that may have been caused in an unwanted manner by the aforementioned antioxidative protection layer can be subsequently corrected in the case of doping according to the invention, and so the accuracy of the ultimately obtained wavefront modification or an adaptation to a wavefront aberration to be compensated in the optical system can be further improved.

In embodiments, the carrier film can also comprise one or more (functional) layers which are responsible for the phase effect or which satisfy the primary function of a wavefront or apodization correction.

According to an embodiment, the variation of the real part of the refractive index in the wavefront correction element according to the invention is configured in such a way that, during the operation of the optical system, a wavefront modification which at least partly corrects a wavefront aberration present in the optical system is brought about for electromagnetic radiation that is transmitted through the wavefront correction element.

According to an embodiment, the variation of the real part of the refractive index over a used region of the surface of the carrier film is at least 10%, in particular at least 20%, further in particular at least 30%, respectively in relation to the maximum value of the real part of the refractive index.

According to an embodiment, the carrier film is produced from a first material, wherein the variation of the real part of the refractive index is produced by doping with impurity atoms of a second material, which differs from the first material.

According to an embodiment, the doping factor integrated along the thickness of the carrier film varies for this doping over a used region of the surface of the carrier film. Here, the doping factor integrated along the thickness of the carrier film is understood to mean the summed doping factor in the direction of the depth or in the beam passage direction. Taking this integrated or summed doping factor as a basis accounts for the fact that the same effect on a light beam can be obtained by way of different doping profiles when said light beam passes through the film or through the wavefront correction element since, overall, the integrated effect of the doping in the beam passage direction is decisive.

The invention further also relates to a wavefront correction element for use in an optical system, in particular in an optical system of a microlithographic projection exposure apparatus or a mask inspection apparatus, comprising:
   a carrier film made of a first material, wherein the carrier film at least partly transmits electromagnetic radiation that has an operating wavelength of the optical system and impinges on the carrier film during the operation of the optical system; and
   doping, present in this carrier film, with impurity atoms of a second material that differs from the first material;
   wherein the doping factor integrated along the thickness of the carrier film varies for this doping over a used region of the surface of the carrier film.

According to an embodiment, the first material is selected from the group containing silicon (Si), zirconium (Zr), molybdenum (Mo), ruthenium (Ru) and niobium (Nb).

According to an embodiment, the second material is selected from the group containing molybdenum (Mo), ruthenium (Ru), carbon (C), niobium (Nb) and titanium (Ti). Here, the second material is preferably selected in such a way that the index difference (n) from the first material is as large as possible.

According to an embodiment, the carrier film further has further doping with impurity atoms of a third material, which differs from the first material and the second material.

According to an embodiment, this further doping at least partly compensates a variation in the intensity, induced by the impurity atoms of the second material, of the electromagnetic radiation transmitted through the wavefront correction element over a used region of the surface of the carrier film.

This takes account of the fact that the impurity atoms introduced into the wavefront correction element according to the invention for the purposes of producing the desired variation of the refractive index by doping have as a consequence not only the desired wavefront correction but also—on account of the absorption occurring at these impurity atoms—an unwanted intensity profile (i.e. intensity variations of the electromagnetic radiation emanating from the wavefront correction element over the used region of the surface). Now, what can be achieved by the aforementioned embodiment of the invention in the case of a suitable selection of the material is that, firstly, the specified unwanted intensity variations are compensated again and, secondly, the wanted wavefront corrective effect of the wavefront correction element is not noticeably changed or impaired either.

Expressed differently, it is possible to avoid unwanted apodization effects (i.e. effects on account of a field profile in the intensity) while simultaneously maintaining the desired wavefront corrective effect by way of said further doping.

The third material can be selected from the group containing germanium (Ge), aluminum (Al), iodine (I), magnesium (Mg) and gallium (Ga). Here, the third material is preferably selected such that the index difference (k) from the second material is as large as possible.

According to an embodiment, the carrier film has a constant thickness.

According to an embodiment, the carrier film has a thickness profile with a varying thickness.

According to an embodiment, a protective layer is provided on at least one side of the carrier film. This protective layer can be e.g. an antioxidative protection layer or a layer for protecting against damage caused by radiation or mechanical damage. By way of example, the protective layer can have silicon dioxide ($SiO_2$) or silicon nitride ($Si_3N_4$).

According to an embodiment, the carrier film is provided on a reflective optical element such as e.g. an EUV mirror. Here, the carrier film according to the invention can be configured, for example, as an intermediate layer in the reflection layer stack of the relevant reflective optical element. Moreover, any (functional) layer (e.g. a molybdenum (Mo) or silicon (Si) layer) of the reflection layer stack of an EUV mirror can also be doped itself, and so the relevant doped layer then brings about the desired wavefront correction (by virtue of constituting a doped carrier film within the meaning of the present invention). The higher the relevant layer is arranged in the direction of the optical effective surface of the reflective optical element, the greater the phase effect obtained by this layer but also the greater the reduction in reflectivity that is caused (and consequently accepted) as a result of the layer.

According to an embodiment, the wavefront correction element is designed for an operating wavelength of less than 30 nm, in particular less than 15 nm. Moreover, the operating wavelength is preferably at least 2 nm (since diffractive optical units are used at wavelengths below 2 nm).

Further, the invention relates to a mirror, in particular for use in an optical system of a microlithographic projection exposure apparatus or a mask inspection apparatus, wherein the mirror has a mirror substrate and a reflection layer stack with a plurality of layers, wherein one of these layers is embodied as a wavefront correction element with the features described above.

Further, the invention also relates to a method for producing a wavefront correction element for use in an optical system, in particular in an optical system of a microlithographic projection exposure apparatus or a mask inspection apparatus, wherein the method comprises the following steps:
    providing a carrier film which at least partly transmits electromagnetic radiation that has an operating wavelength of the optical system and impinges on the carrier film during the operation of the optical system; and
    processing the carrier film in such a way that a variation of the real part of the complex refractive index is produced over a used region of the surface of the carrier film.

According to an embodiment, the carrier film is produced from a first material, wherein the processing of the carrier film comprises doping with impurity atoms of a second material, which differs from the first material.

According to an embodiment, a protective layer (e.g. an antioxidative protection layer) is embodied on at least one side of the carrier film.

According to an embodiment, the doping with impurity atoms of a second material is effectuated after forming the protective layer.

According to an embodiment, the processing of the carrier film further comprises doping with impurity atoms of a third material, which differs from the first material and the second material.

In respect of further preferred configurations and advantages of the method, reference is made to the explanations, made above, in conjunction with the wavefront correction element according to the invention.

The invention further relates to an optical system of a microlithographic projection exposure apparatus, in particular an illumination device or a projection lens, and to a microlithographic projection exposure apparatus having at least one wavefront correction element with the above-described features.

Further configurations of the invention can be gathered from the description and the dependent claims.

The invention is explained in greater detail below on the basis of exemplary embodiments illustrated in the accompanying figures.

DETAILED DESCRIPTION

Below, the possible construction of a wavefront correction element according to the invention is described initially with reference to the schematic illustration shown in FIG. 1.

Figure 1:
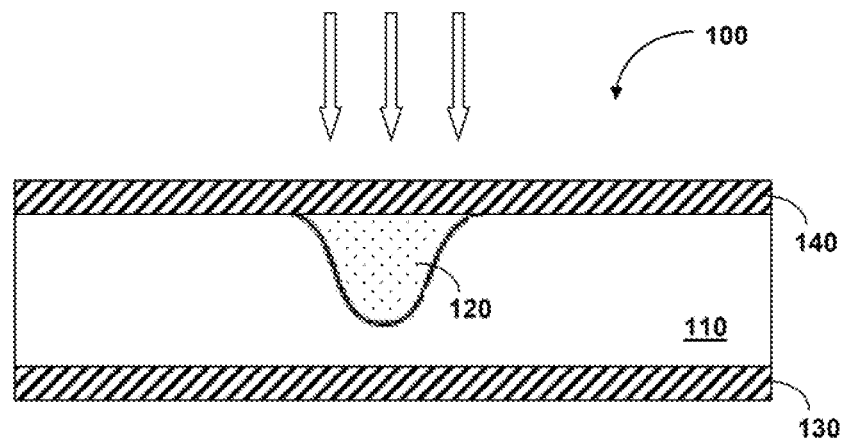
FIG. 1 shows a schematic illustration for elucidating the construction of a wavefront correction element according to a first embodiment of the invention.

According to FIG. 1, a wavefront correction element 100 has, in particular, a carrier film 110 which is produced from silicon (Si) in the exemplary embodiment and has an exemplary thickness of 200 nm. A protective layer (e.g. an antioxidative protection layer) 130 and 140 is formed both on the light-entrance side and on the light-exit side of the carrier film 110, the thicknesses of said protective layers being able to be, in a purely exemplary manner, in the region of 1-2 nm and being able to be produced from e.g. silicon nitride ($Si_3N_4$).

Moreover, the carrier film 110 has a variation in the refractive index (in particular in the real part of the complex refractive index) over the used region of its surface, with this variation being obtained by virtue of the carrier film 110 being doped by impurity atoms 120 made of a second material, wherein the doping factor of this doping varies within the carrier film 110 over the used region of the carrier film. In FIG. 1, a Gaussian profile of this doping factor is specified in a purely exemplary manner. As will be explained below with reference to FIG. 3, more complex profiles of the doping factor are also possible, wherein, in particular, the same effect on a light beam passing through the film or through the wavefront correction element can be obtained by way of different (but "equivalently acting") doping profiles since, overall, the integral effect in the beam passage direction or along the thickness or the depth of the wavefront correction element is decisive.

Said doping can be carried out in a final manufacturing step during the production of the wavefront correction element 100 and, in particular, after a preceding application of the relevant protective layers 130, 140.

The doping according to the invention with impurity atoms is preferably effectuated in a targeted manner using impurity atoms of a material which has a comparatively low influence on the absorption, i.e. in which the imaginary part of the complex refractive index or the value β (which describes the absorption) is low. By contrast, the difference between carrier material and the material of the impurity atoms introduced by the doping in the parameter δ is decisive for the phase deviation, with, as a rule, a phase deviation that is as large as possible being desirable. Here, in general, the relationship applies that the maximum phase difference $\Delta_{max}$ for two rays which pass through different regions of the carrier film is substantially given by $$\Delta_{max} = abs(\delta_1 - \delta_2) * d \quad (2)$$

where $\delta_1$ denotes the parameter δ for the undoped material of the carrier film, $\delta_2$ denotes the parameter δ for the doped material and d denotes the thickness of the carrier film.

By way of example, if silicon (Si) with a value of $\delta_1 = 0.001$ is used as first material of the carrier film and molybdenum (Mo) with a value of $\delta_2 = 0.076$ is used as a second material of the impurity atoms that are introduced by doping, this results in a value of $\Delta_{max} = (0.076 - 0.001) * 100$ nm = 7.5 nm for the maximum obtainable phase deviation for an exemplary thickness of the carrier film of 100 nm which, in the case of an operating wavelength of λ=13.5 nm, approximately corresponds to a maximum obtainable phase deviation of π. This value can also be appropriately increased by selecting a greater thickness of the carrier film, for example to approximately 2π in the case of a thickness of the carrier film of 200 nm, etc. Setting the maximum phase deviation corresponds here to 100% doping, wherein e.g. a quarter of this value is obtained accordingly in the case of 25% doping.

Figure 3:
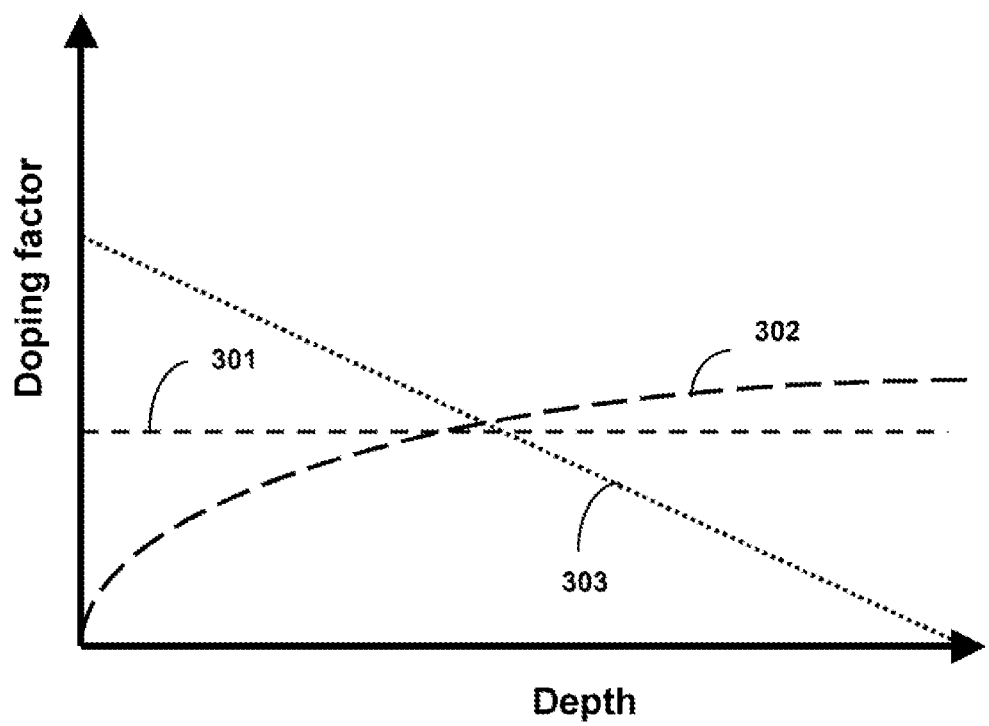
FIG. 3 shows a diagram for explaining the principle of distributions of the doping factor along the beam direction with an equivalent effect.

More complicated distributions in view of the doping factor are possible within the scope of the invention since all that is important is the integral effect in the beam passage direction. In a qualitative diagram, FIG. 3 shows different doping examples with an equivalent effect in the beam passage direction, with the doping factor in each case being plotted as a function of the depth of the wavefront correction element. Graph 301 shows homogeneous doping along the depth, graph 303 shows a linearly decreasing profile and graph 302 shows a more complicated profile with a doping factor that increases with depth. Since the integrated areas under the graph are the same in each case in the diagram, the effects on the light beam when passing through the film or through the wavefront correction element are also identical. Moreover, various profiles, for example according to FIG. 3, can also be combined over the used region of the surface of the carrier film or of the wavefront correction element.

A method that is suitable for the doping according to the invention is the ion implantation technique, in which degrees of doping can be set, for example in the range from 10% to 20%. In respect of the method of the ion implantation technique, reference is made in a purely exemplary manner to the publications H. Ryssel, I. Ruge: "Ion Implantation", J. Wiley & Sons, Chichester 1986, ISBN 0-471-10311-X and "Handbook of ion beam processing technology", edited by J. J. Cuomo, S. M. Rossnagel, HR Kaufman Noyes Publications 1989.

By way of example, depending on the material of the impurity atoms, the energy of the impurity atoms implanted during the doping can lie in the range from 1 keV to 100 keV. The ion fluxes set during the implantation can be suitably selected taking into account the thermal capacity of the carrier film (and avoiding excessive heating that may lead to a breakup thereof), for example in the range of a few pA/cm$^2$ to several 10 μA/cm$^2$.

Figure 4:
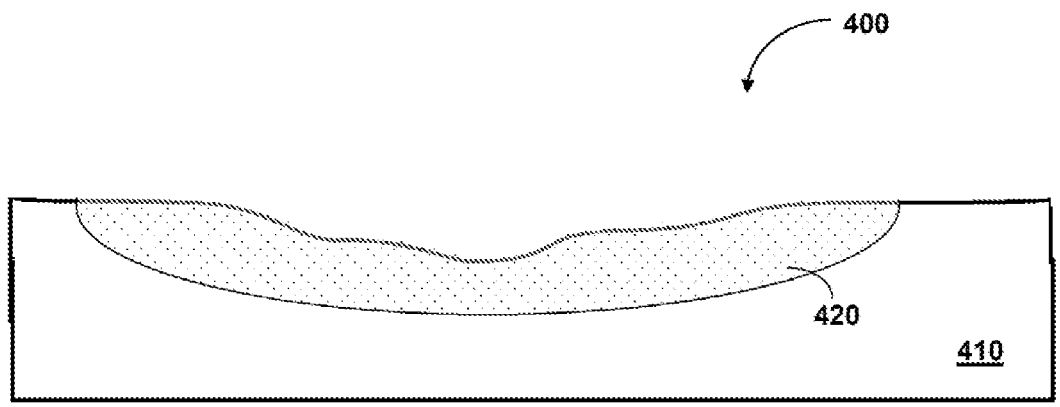
FIG. 4 shows a schematic illustration for elucidating the construction of a wavefront correction element according to a further embodiment of the invention.

According to FIG. 1, the carrier film 110 or the wavefront correction element 100 has a constant thickness such that, in particular, a regional ablation of material of the carrier film, which may be accompanied by mechanical destabilization, is avoided. However, the invention is not restricted thereto, with a carrier film 410 also having a thickness profile with a varying thickness in further embodiments, as illustrated schematically in FIG. 4. Incidentally, in FIG. 4, components analogous or substantially functionally identical to FIG. 1 are denoted by reference numerals increased by "300". As a consequence, the phase or wavefront effect of a varying thickness profile of the carrier film 410 is combined according to FIG. 4 with the phase or wavefront effect according to the invention on account of the doping with impurity atoms 420, wherein, in particular, a fine setting of the phase effect or the wavefront modification can be effectuated by said doping.

Figure 2:
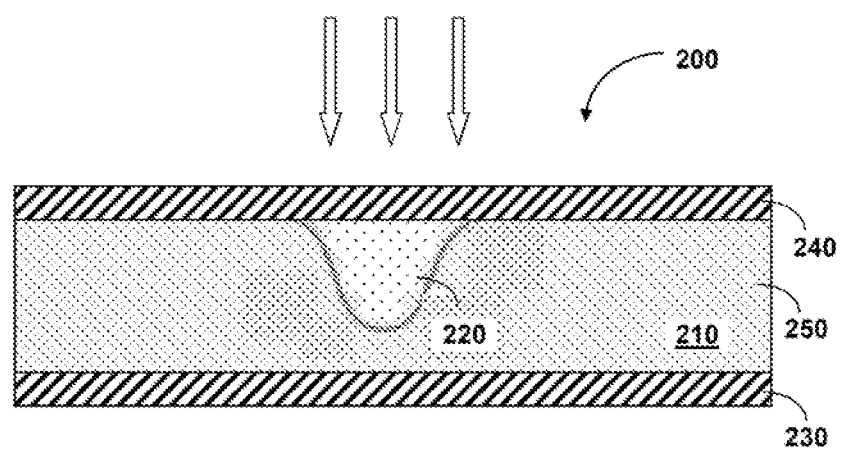
FIG. 2 shows a schematic illustration for elucidating the construction of a wavefront correction element according to a further embodiment of the invention.

FIG. 2 shows a further embodiment of a wavefront correction element 200 according to the invention, wherein components which are analogous or substantially have the same function are denoted by reference signs increased by "100" in relation to FIG. 1.

The wavefront correction element 200 according to FIG. 2 differs from that in FIG. 1 by virtue of provision additionally being made of a further ("secondary") doping of impurity atoms 250 of a third material, which serves to at least partly compensate an unwanted intensity variation that is induced by the ("primary") doping with the impurity atoms 220 of the second material over a used region of the surface of the carrier film 210.

As indicated purely schematically in FIG. 2, said secondary doping with impurity atoms 250 is configured in an inverse or complementary fashion to the primary doping of impurity atoms 220 to the extent that, overall, a transmission profile that is as constant as possible emerges over the field or over the used region of the surface of the wavefront correction element 200. The principle described above with reference to FIG. 3, according to which the same effect on a light beam passing through the film or through the wavefront correction element can be obtained by way of different (but "equivalently acting") doping examples in the beam passage direction or along the depth since, overall, the integral effect in the beam passage direction is decisive, also applies in respect of this secondary doping.

Moreover, in respect of the secondary doping, the invention is not restricted to the doping that is inverse or complementary to the primary doping and described above on the basis of FIG. 2. Thus, in further embodiments, said secondary doping may also be present in regions in which the primary doping is also already situated.

Figure 5A:
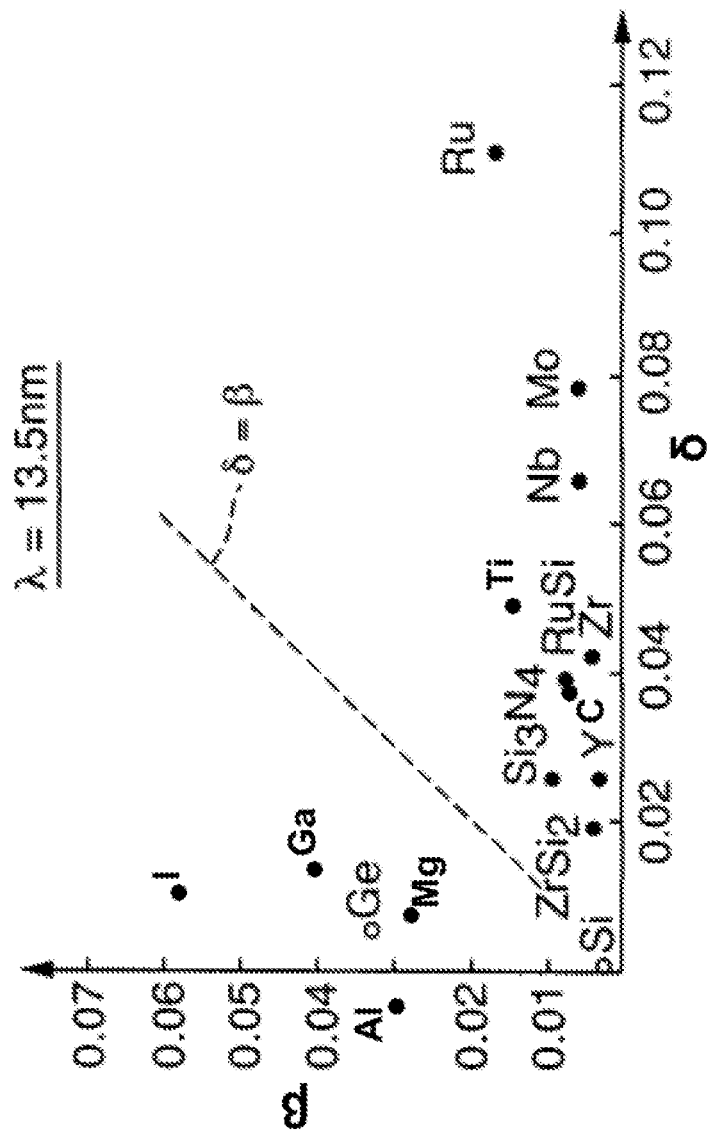
FIGS. 5A and 5B show schematic illustrations in which values of the complex refractive index are plotted for different materials that can be used in a wavefront correction element.
Figure 5B:
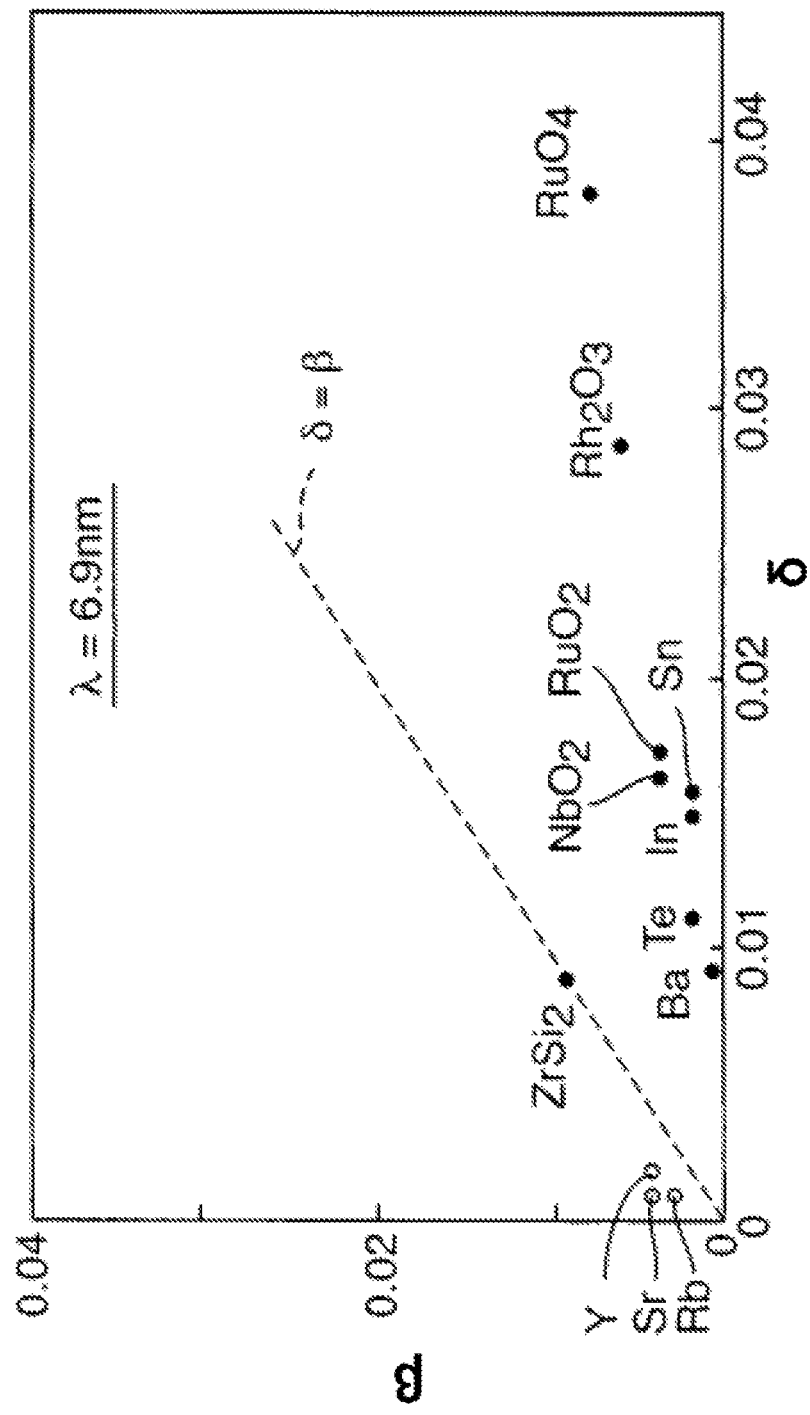

FIGS. 5A and 5B plot values of the complex refractive index for further different materials that can be used in a wavefront correction element according to the invention, with FIG. 5A plotting the corresponding values for selected materials at an operating wavelength of λ=13.5 nm and FIG. 5B plotting the corresponding values for selected materials at an operating wavelength of λ=6.9 nm. In principle, materials with a comparatively large phase deviation (with a comparatively large δ value) are suitable for the primary doping with impurity atoms according to the invention, wherein, at the same time, the δ value should not exceed a critical value of approximately 0.01 to 0.02 for the purposes of restricting transmission losses (particularly in the case of a limited source power). To this end, molybdenum (Mo), ruthenium (Ru), carbon (C), niobium (Nb) and titanium (Ti), in particular, are suitable materials at λ=13.5 nm, wherein the respective δ value and β value for these materials at λ=13.5 nm is specified in table 1:

TABLE 1

| Material | δ value | β value |
|---|---|---|
| Molybdenum (Mo) | 0.076200545 | 0.0064345 |
| Ruthenium (Ru) | 0.113630742 | 0.017061159 |
| Carbon (C) | 0.038424399 | 0.006904726 |
| Niobium (Nb) | 0.066245429 | 0.005195308 |
| Titanium (Ti) | 0.048080225 | 0.014182366 |

Suitable materials for the secondary doping (with impurity atoms 250) for correcting the transmission of the overall wavefront, described on the basis of FIG. 2, are distinguished by a phase deviation that is as low as possible while having, at the same time, a comparatively large absorption, wherein the δ value should be substantially less than 0.01 and the β value should be substantially greater than 0.01. Exemplary suitable materials for this secondary doping at λ=13.5 nm are germanium (Ge), aluminum (Al), iodine (I), magnesium (Mg) and gallium (Ga), wherein the respective δ value and β value for these materials at λ=13.5 nm is specified in table 2:

TABLE 2

| Material | δ value | β value |
|---|---|---|
| Germanium (Ge) | 0.005335126 | 0.032091424 |
| Aluminum (Al) | −0.002843466 | 0.029659614 |
| Iodine (I) | 0.012140397 | 0.058258455 |
| Magnesium (Mg) | 0.007833972 | 0.027692031 |
| Gallium (Ga) | 0.014838818 | 0.03930077 |

Since the absorption properties of the material are defined by the imaginary part of the complex refractive index, what can be achieved by the embodiment described on the basis of FIG. 2 is that, in the case of a secondary doping with a doping pattern that is "inverted" or complementary to the primary doping, the field profile in the intensity, induced by the primary doping in an unwanted manner, is just compensated.

Even though the wavefront correction element according to the invention, in particular as a wavefront correction film, additionally can be introduced in a virtually "freestanding" manner into the relevant optical system for obtaining a desired wavefront modification, the invention should also be considered to comprise configurations in further embodiments in which the wavefront correction element is provided on a reflective optical element (in particular an EUV mirror), wherein the carrier film according to the invention, for example, can be configured—as already explained above—as an intermediate layer in the reflection layer stack of the relevant reflective optical element. Doping of any (functional) layer (e.g. a molybdenum (Mo) or silicon (Si) layer) of the reflection layer stack of an EUV mirror itself is also possible, and so the relevant layer that is doped according to the invention then brings about the desired wavefront correction. The higher the relevant layer is arranged in the direction of the optical effective surface of the EUV mirror, the greater the phase effect obtained by this layer but also the greater the reduction in reflectivity that is caused (and consequently accepted) as a result of the layer.

Figure 6:
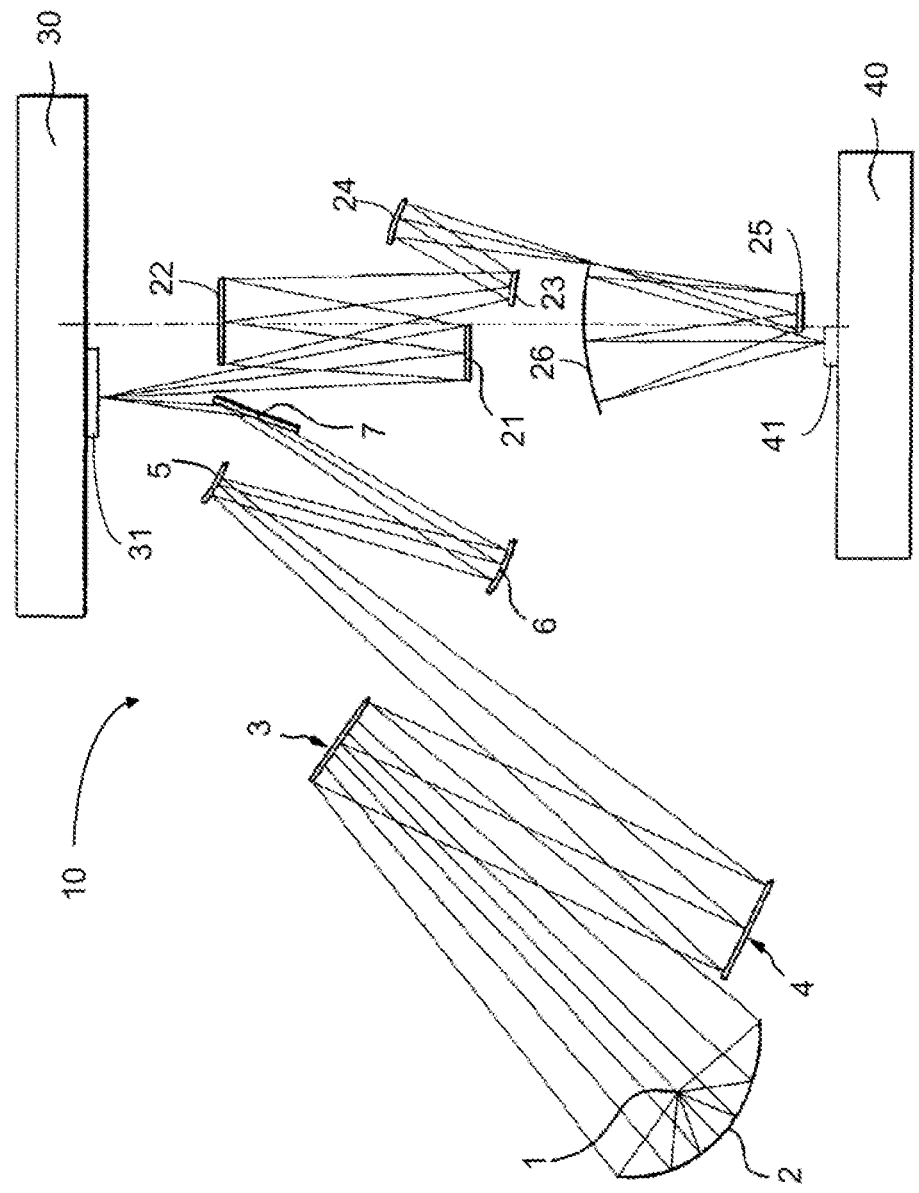
FIG. 6 shows a schematic illustration of the possible construction of a microlithographic projection exposure apparatus designed for operation in the EUV range.

FIG. 6 shows a schematic illustration of an exemplary projection exposure apparatus which is designed for operation in EUV and which can comprise a wavefront correction element according to the invention.

According to FIG. 6, an illumination device in a projection exposure apparatus 10 designed for EUV comprises a field facet mirror 3 and a pupil facet mirror 4. The light from a light source unit comprising, purely by way of example, a plasma light source 1 and a collector mirror 2 is directed onto the field facet mirror 3. A free electron laser (FEL), for example, also can be used as a light source in further embodiments. A first telescope mirror 5 and a second telescope mirror 6 are arranged in the light path downstream of the pupil facet mirror 4. A deflection mirror 7 is arranged downstream in the light path, said deflection mirror directing the radiation impinging thereon onto an object field in the object plane of a projection lens comprising six mirrors 21-26. At the location of the object field, a reflective structure-bearing mask 31 is arranged on a mask stage 30, said mask being imaged with the aid of the projection lens into an image plane in which a substrate 41 coated with a light-sensitive layer (photoresist) is situated on a wafer stage 40. At least one wavefront correction element according to the invention, in accordance with the embodiments described above, may be arranged in the projection exposure apparatus, wherein the position of the wavefront correction element can be selected in a suitable manner depending on the specific conditions (e.g. installation space and extent of the required correction). Moreover, as already mentioned previously, a wavefront correction element according to the invention either can be configured as a freestanding wavefront correction element or else be provided on at least one mirror that is present in the illumination device or in the projection lens.

Even though the invention has been described on the basis of specific embodiments, numerous variations and alternative embodiments are apparent to a person skilled in the art, for example by combination and/or exchange of features of individual embodiments. Accordingly, such variations and alternative embodiments are concomitantly encompassed by the present invention, and the scope of the invention is restricted only within the meaning of the accompanying patent claims and equivalents thereof.

What is claimed is:

1. A wavefront correction element for use in an optical system, comprising:
    a carrier film which at least partly transmits electromagnetic radiation that has an operating wavelength of the optical system and impinges on a surface of the carrier film during operation of the optical system;
    wherein the carrier film is configured such that a real part of a complex refractive index of the carrier film varies over a used region of the surface of the carrier film,
    wherein the carrier film is produced from a first material, wherein the variation of the real part of the refractive index is produced by doping the carrier film with impurity atoms of a second material,
    wherein the carrier film has further doping with impurity atoms of a third material, which differs from the first material and from the second material, and
    wherein the further doping at least partly compensates a variation in the intensity, induced by the impurity atoms of the second material, of the electromagnetic radiation transmitted through the wavefront correction element over a used region of the surface of the carrier film.

2. The wavefront correction element as claimed in claim 1, wherein the variation of the real part of the refractive index is configured such that, during the operation of the optical system, a wavefront modification which at least partly corrects a wavefront aberration present in the optical system is brought about for electromagnetic radiation that is transmitted through the wavefront correction element.

3. The wavefront correction element as claimed in claim 1, wherein the variation of the real part of the refractive index over a used region of the surface of the carrier film is at least 10% in relation to the maximum value of the real part of the refractive index.

4. The wavefront correction element as claimed in claim 1, wherein the doping factor integrated along the thickness of the carrier film varies for the doping over the used region of the surface of the carrier film.

5. The wavefront correction element as claimed in claim 1, wherein the first material is selected from the group consisting of silicon (Si), zirconium (Zr), molybdenum (Mo), ruthenium (Ru) and niobium (Nb).

6. The wavefront correction element as claimed in claim 1, wherein the second material is selected from the group consisting of molybdenum (Mo), ruthenium (Ru), carbon (C), niobium (Nb) and titanium (Ti).

7. The wavefront correction element as claimed in claim 1, wherein the third material is selected from the group containing germanium (Ge), aluminum (Al), iodine (I), magnesium (Mg) and gallium (Ga).

8. The wavefront correction element as claimed in claim 1, wherein the carrier film has a constant thickness.

9. The wavefront correction element as claimed in claim 1, wherein the carrier film has a thickness profile with a varying thickness.

10. The wavefront correction element as claimed in claim 1, wherein a protective layer is provided on at least one side of the carrier film.

11. The wavefront correction element as claimed in claim 1, wherein the carrier film is provided on a reflective optical element.

12. The wavefront correction element as claimed in claim 1 and configured for an operating wavelength of less than 30 nm.

13. A mirror, comprising a mirror substrate and a reflection layer stack with a plurality of layers, wherein one of the layers is embodied as a wavefront correction element as claimed in claim 1.

14. A method for producing a wavefront correction element configured for an optical system, comprising:
providing a carrier film which at least partly transmits electromagnetic radiation that has an operating wavelength of the optical system and impinges on a surface of the carrier film during operation of the optical system, wherein the carrier film is produced from a first material; and
processing the carrier film such that a variation of a real part of a complex refractive index of the carrier film is produced over a used region of the surface of the carrier film,
wherein the processing of the carrier film comprises:
doping the carrier film with impurity atoms of a second material, which differs from the first material,
further doping the carrier film with impurity atoms of a third material, which differs from the first material and from the second material, and
wherein the further doping at least partly compensates a variation in the intensity, induced by the impurity atoms of the second material, of the electromagnetic radiation transmitted through the wavefront correction element over a used region of the surface of the carrier film.

15. The method as claimed in claim 14, wherein a protective layer is embodied on at least one side of the carrier film.

16. The method as claimed in claim 15, wherein the doping with the impurity atoms of the second material is effectuated after forming the protective layer.

17. An optical system of a microlithographic projection exposure apparatus, comprising at least one wavefront correction element as claimed in claim 1.

18. A microlithographic projection exposure apparatus comprising an illumination device and a projection lens, wherein the projection exposure apparatus comprises a wavefront correction element as claimed in claim 1.

* * * * *

UNITED STATES PATENT AND TRADEMARK OFFICE
CERTIFICATE OF CORRECTION

PATENT NO. : 10,151,922 B2
APPLICATION NO. : 15/789200
DATED : December 11, 2018
INVENTOR(S) : Banyay et al.

Page 1 of 1

It is certified that error appears in the above-identified patent and that said Letters Patent is hereby corrected as shown below:

On the Title Page

Item (56), Column 2, Delete "University" and insert -- Cambridge University --, therefor.

In the Specification

Column 8, Line 62, Delete "δ" and insert -- β --, therefor.

Column 9, Line 6, Delete "6" and insert -- δ --, therefor.

Column 9, Line 28, Delete "6" and insert -- δ --, therefor.

Signed and Sealed this
Twenty-third Day of July, 2019

Andrei Iancu
*Director of the United States Patent and Trademark Office*